(12) United States Patent
Park et al.

(10) Patent No.: US 7,208,718 B2
(45) Date of Patent: Apr. 24, 2007

(54) LIGHT SENSING PANEL, AND LIQUID CRYSTAL DISPLAY APPARATUS HAVING THE SAME

(75) Inventors: Sang-Jin Park, Yongin-si (KR); Kee-Han Uh, Yongin-si (KR); Young-Bae Jung, Suwon-si (KR); Jong-Whan Cho, Gunpo-si (KR); Young-Jun Choi, Suwon-si (KR)

(73) Assignee: Samsung Electronics Co. Ltd., Suwon-si (KR)

( * ) Notice: Subject to any disclaimer, the term of this patent is extended or adjusted under 35 U.S.C. 154(b) by 122 days.

(21) Appl. No.: 11/021,886

(22) Filed: Dec. 24, 2004

(65) Prior Publication Data

US 2005/0139751 A1 Jun. 30, 2005

(30) Foreign Application Priority Data

Dec. 26, 2003 (KR) ............... 10-2003-0097144

(51) Int. Cl.
*G01J 1/44* (2006.01)
*G01J 1/42* (2006.01)
*G02F 1/136* (2006.01)

(52) U.S. Cl. ............... 250/214 R; 250/208.2; 349/43

(58) Field of Classification Search ........... 250/208.1, 250/208.2; 345/173
See application file for complete search history.

(56) References Cited

U.S. PATENT DOCUMENTS

2005/0116937 A1* 6/2005 Choi et al. ............. 345/173

* cited by examiner

*Primary Examiner*—Georgia Epps
*Assistant Examiner*—Don Williams
(74) *Attorney, Agent, or Firm*—F. Chau & Associates, LLC

(57) ABSTRACT

A light sensing panel includes a scan line transmitting a scan signal, a power source line transmitting a bias voltage, a readout line transmitting a light sensing signal and a light sensing device. The light sensing device includes a control electrode that is electrically connected to the scan line to receive the scan signal, a first current electrode that is electrically connected to the power source line to receive the bias voltage, and a second current electrode that is electrically connected to the readout line to apply a light sensing signal to the readout line when the light sensing signal senses an external light. The light sensing panel requires only one thin film transistor in order to detect a position wherein the external light is incident. Therefore, electrical coupling between devices is reduced and aperture ratio is increased, thereby enhancing a display quality.

18 Claims, 12 Drawing Sheets

LIGHT SENSING PANEL, AND LIQUID CRYSTAL DISPLAY APPARATUS HAVING THE SAME

CROSS-REFERENCE TO RELATED APPLICATIONS

This application relies for priority upon Korean Patent Application No.2003-97144 filed on Dec. 26, 2003, the contents of which are herein incorporated by reference in its entirety.

BACKGROUND OF THE INVENTION

1. Field of the Invention

The present invention relates to a light sensing panel and liquid crystal display apparatus having the light sensing panel. More particularly, the present invention relates to a light sensing panel that prevents lowering of aperture ratio, and a liquid crystal display apparatus having the light sensing panel.

2. Description of the Related Art

Generally, a light sensing sensor senses an external light to detect an entrance position of the external light. Willem den Boer disclosed a liquid crystal display apparatus having a plurality of the light sensing sensors arranged in a matrix shape to have a function of finger print identification or touch panel by a paper entitled "Active Matrix LCD with Integrated Optical Touch Screen" in 2003.

FIG. 1 is an equivalent circuit diagram of a conventional light sensing sensor formed in an array substrate. Particularly, FIG. 1 discloses the light sensing sensor formed in a unit pixel of a liquid crystal display panel.

Referring to FIG. 1, a liquid crystal display panel having a conventional light sensing sensor includes a plurality of gate lines GL, a plurality of data lines DL, a first switching device Q1 that is electrically connected to each of the gate lines and data lines DL, a liquid crystal capacitor CLC and a first storage capacitor CST1. Furthermore, the liquid crystal display apparatus includes a first power source line VL1 and a second power source line VL2, a second switching device TS1 generating currents in accordance with an external light, a second storage capacitor CST2 stores electric charges provided from the second switching device TS1, a third switching device TS2 that outputs the electric charges stored in the second storage capacitor CST2, and a readout line ROL. The second switching device TS1, the second storage capacitor CST2 and the third switching device TS2 operate as a light sensing sensor.

Hereinafter, an operation of the light sensing sensor will be explained.

When the second switching device receives an external light, a negative voltage is applied to the first power source line VL1, and a positive voltage is applied to the second power source line VL2 that is electrically connected to a drain electrode of the second switching device TS1, so that the second switching device TS1 is turned off. Then, the second switching device TS1 that receives the external light generates more photocurrent than the third switching device TS2 that does not receive the external light.

The photocurrent charges the second storage capacitor CST2 with electricity when the third switching device TS2 is turned off. The second storage capacitor CST2 maintains electric charges until the third switching device TS2 is turned on.

When a gate signal of high level is applied to a next gate line GQ+1 that is electrically connected to the third switching device TS2, electric charges stored in the second storage capacitor CST2 are applied to a readout circuit section (not shown) via the third switching device TS2 and a readout line ROL.

As described above, the light sensing sensor formed on the array substrate detects a light.

However, a size of a region in which the light sensing sensor is disposed is insufficient. Therefore, a design for the array substrate may be limited.

When the light sensing sensor is employed by the array substrate of a transmissive type or transflective liquid crystal display apparatus, an aperture ratio is lowered. Additionally, the light sensing sensor has two transistors and one capacitor, that is, the light sensing sensor has tree devices. Therefore, possibility of defects may increase. Furthermore, possibility of interference between the devices may also increase.

SUMMARY OF THE INVENTION

The present invention provides a light sensing panel having a light sensing sensor with simple structure in order to reduce lowering of aperture ratio, defects and interference.

The present invention also provides a liquid crystal display apparatus having the light sensing panel.

In an exemplary light sensing panel according to the present invention, a light sensing panel includes a scan line, a power source line, a readout line and a light sensing device. The scan line transmits a scan signal swinging between high and low levels. The power source line transmits a bias voltage. The readout line transmits a light sensing signal. The light sensing device includes a control electrode that is electrically connected to the scan line to receive the scan signal, a first current electrode that is electrically connected to the power source line to receive the bias voltage, and a second current electrode that is electrically connected to the readout line to apply a light sensing signal to the readout line when the light sensing signal senses an external light.

In another exemplary light sensing panel according to the present invention, the light sensing panel includes a gate line, a data line, a pixel part, a scan line, a power source line, a readout line and a light sensing part. The gate line transmits a gate signal. The data line transmits a data signal. The pixel part is formed in a first region defined by the gate line and the data line. The scan line transmits a scan signal that swings between high and low levels. The power source line transmits a bias voltage. The readout line transmits a light sensing signal. The light sensing part is formed in a second region defined by the scan line, the power source line and the readout line. The light sensing part applies the light sensing signal to the readout line by the scan signal and the bias voltage, when the light sensing part receives an external light.

In an exemplary liquid crystal display apparatus according to the present invention, the liquid crystal display apparatus includes an upper substrate, a lower substrate and a liquid crystal layer interposed between the upper and lower substrates. The lower substrate includes a light sensing part formed in a region defined by a scan line, a power source line and a readout line. The light sensing part applies a light sensing signal to the readout line by a scan signal that is provided from the scan line and swings between high and low levels, and a bias voltage that is provided from the power source line.

According to the present invention, the light sensing panel requires only one thin film transistor in order to detect a position wherein the external light is incident. Therefore, electrical coupling between devices is reduced and aperture ratio is increased, thereby enhancing a display quality.

BRIEF DESCRIPTION OF THE DRAWINGS

The above and other features and advantage points of the present invention will become more apparent by describing in detailed exemplary embodiments thereof with reference to the accompanying drawings, in which.

DESCRIPTION OF EMBODIMENTS

Hereinafter, the embodiments of the present invention will be described in detail with reference to the accompanied drawings.

Figure 1:
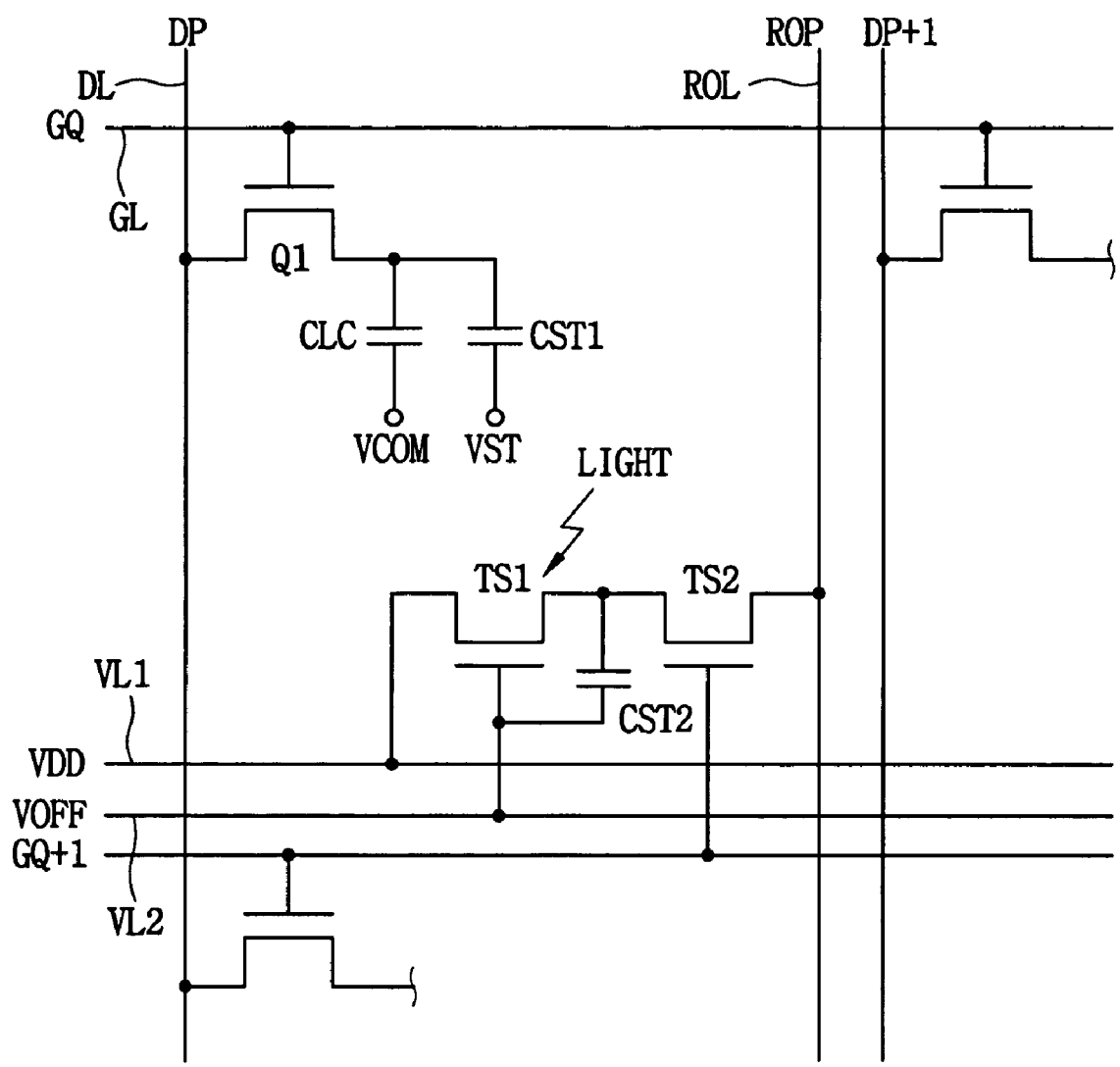
FIG. 1 is an equivalent circuit diagram of a conventional light sensing sensor formed in an array substrate.
Figure 2:
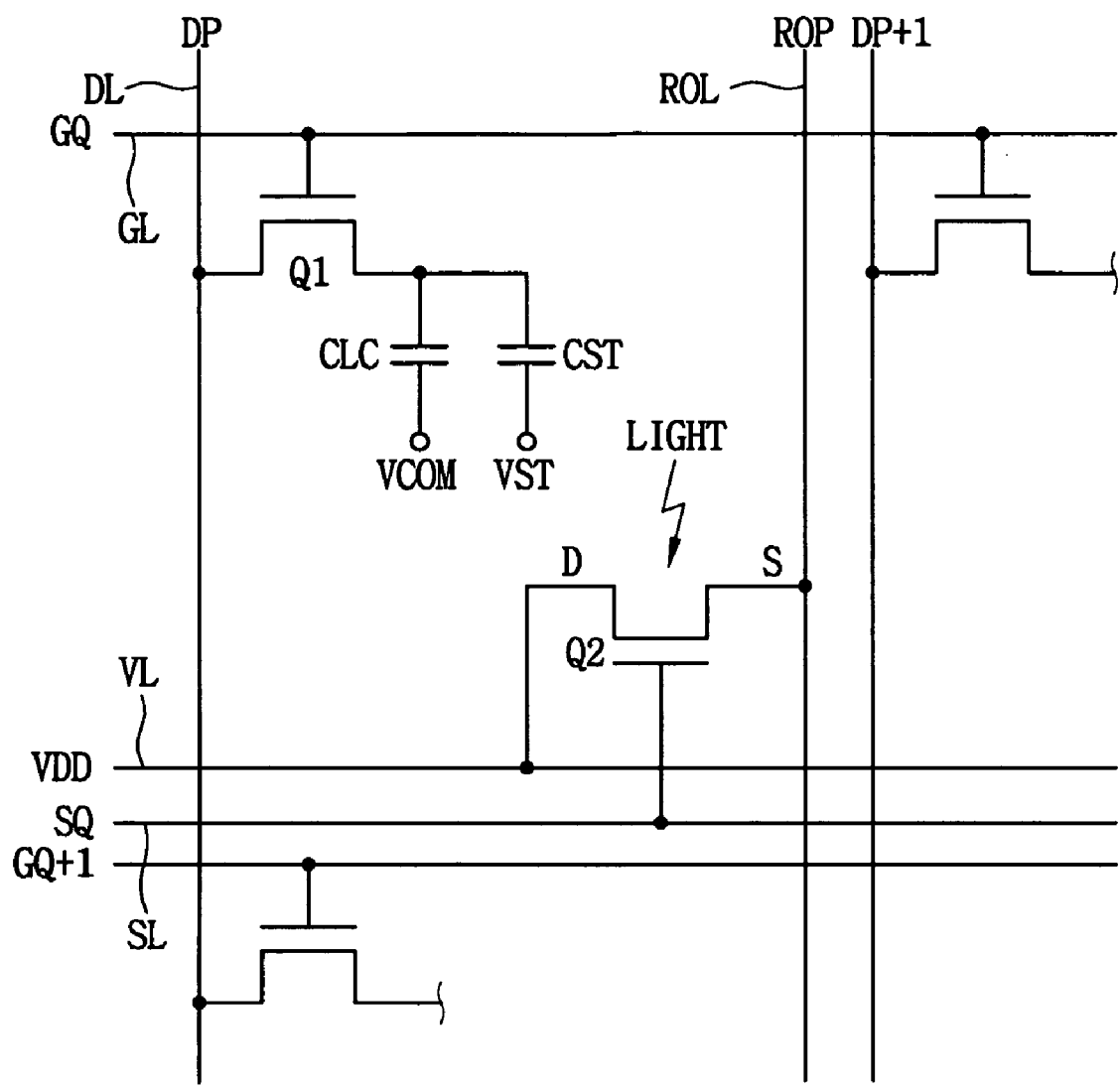
FIG. 2 is an equivalent circuit diagram of a light sensing sensor according to an exemplary embodiment of the present invention.

FIG. 2 is an equivalent circuit diagram of a light sensing sensor according to an exemplary embodiment of the present invention. FIG. 2 illustrates only one unit pixel of a liquid crystal display panel.

Referring to FIG. 2, a liquid crystal display panel having a light sensing sensor includes a gate line GL, a data line DL, a switching device Q1, a liquid crystal capacitor CLC, a storage capacitor CST, a power source line VL, a scan line SL, a light sensing device Q2 and a readout line ROL.

The gate line GL is extended in a horizontal direction, and a gate signal GQ is applied to the switching device Q1 via the gate line GL. The data line DL is extended in a vertical direction, and a data signal DP is applied to the switching device Q1.

The switching device Q1 is formed in a region defined by the gate line GL and the data line DL. The switching device Q1 has a drain electrode, a gate electrode that is electrically connected to the gate line GL, and a source electrode that is electrically connected to the data line DL. When high level gate signal GQ is applied to the switching device Q1 via the gate line GL, the switching device is turned on, so that the data signal DP is outputted via the drain electrode.

The liquid crystal capacitor CLC has a first end that is electrically connected to the switching device Q1 and a second end where the data signal DP is applied thereto, so that the liquid crystal capacitor CLC stores the data signal DP provided from the drain electrode of the switching device Q1.

The storage capacitor CST has a first end that is electrically connected to the drain electrode of the switching device Q1, and a second end where a storage voltage VST is applied thereto. The storage capacitor CST helps the liquid crystal capacitor to maintain the data signal.

The power source line VL is extended in the horizontal direction. A bias voltage VDD is applied to the light sensing device Q2. The scan line SL is extended in the horizontal direction. A scan signal SQ is applied to the light sensing device Q2 via the scan line SL.

The light sensing device Q2 is formed in a region defined by the power source line VL and the scan line SL, and the light sensing device Q2 has a drain electrode that is electrically connected to the power source line VL, and a gate electrode that is electrically connected to the scan line SL.

When a light is applied to a channel layer of the light sensing device Q2, a photocurrent generated by the light is applied to the readout line ROL via a source electrode of the light sensing device Q2. The photocurrent is a light sensing signal that corresponds to a position information signal.

The photocurrent outputted from the source electrode of the light sensing device Q2 flows to an external driver IC (not shown) via the readout line ROL.

The bias voltage VDD is applied to the drain electrode of the light sensing device Q2, the scan signal SQ is applied to the gate electrode of the light sensing device Q2, and a light is applied to the channel layer of the light sensing device Q2. Therefore, the position information signal is outputted via the source electrode of the light sensing device Q2. The photocurrent that flows through the channel layer is detected based on the bias voltage VDD and the scan signal SQ. For example, the photocurrent is not generated even when the bias voltage VDD of about 15V is applied to the drain electrode, the scan signal SQ of high or low level is applied to the gate electrode, and an external light is not applied to the channel layer.

However, when the external light is applied to the channel layer, the photocurrent may flow through the channel layer due to the bias voltage VDD of about 15V.

When a scan signal SQ of low level of about −7.5V is applied to the gate electrode, the photocurrent is not applied to the readout line ROL. However, when a scan signal of high level of about 5V is applied to the gate electrode, the photocurrent is applied to the readout line ROL. Therefore, the photocurrent is applied to the driver IC (not shown).

The driver IC (not shown) detects position information of the pixel where the external light is detected based on a variation of the light sensing signal (or position information signal).

Since the light sensing signal corresponds to an off-current in a turn off region of the light sensing device Q2, the light sensing signal is weak. Therefore, an amplifier or noise filter may be disposed between the driver IC and the readout line ROL.

Hereinbefore, the liquid crystal display panel includes the power source line VL, the scan line SL, the light sensing device Q2 and the readout line ROL. However, the power source line VL, the scan line SL, the light sensing device Q2 and the readout line ROL may be formed on a separate substrate that corresponds to a pattern recognition panel. The pattern recognition panel that operates as a touch panel or finger print recognition panel may be disposed on the liquid crystal display panel.

Figure 3:
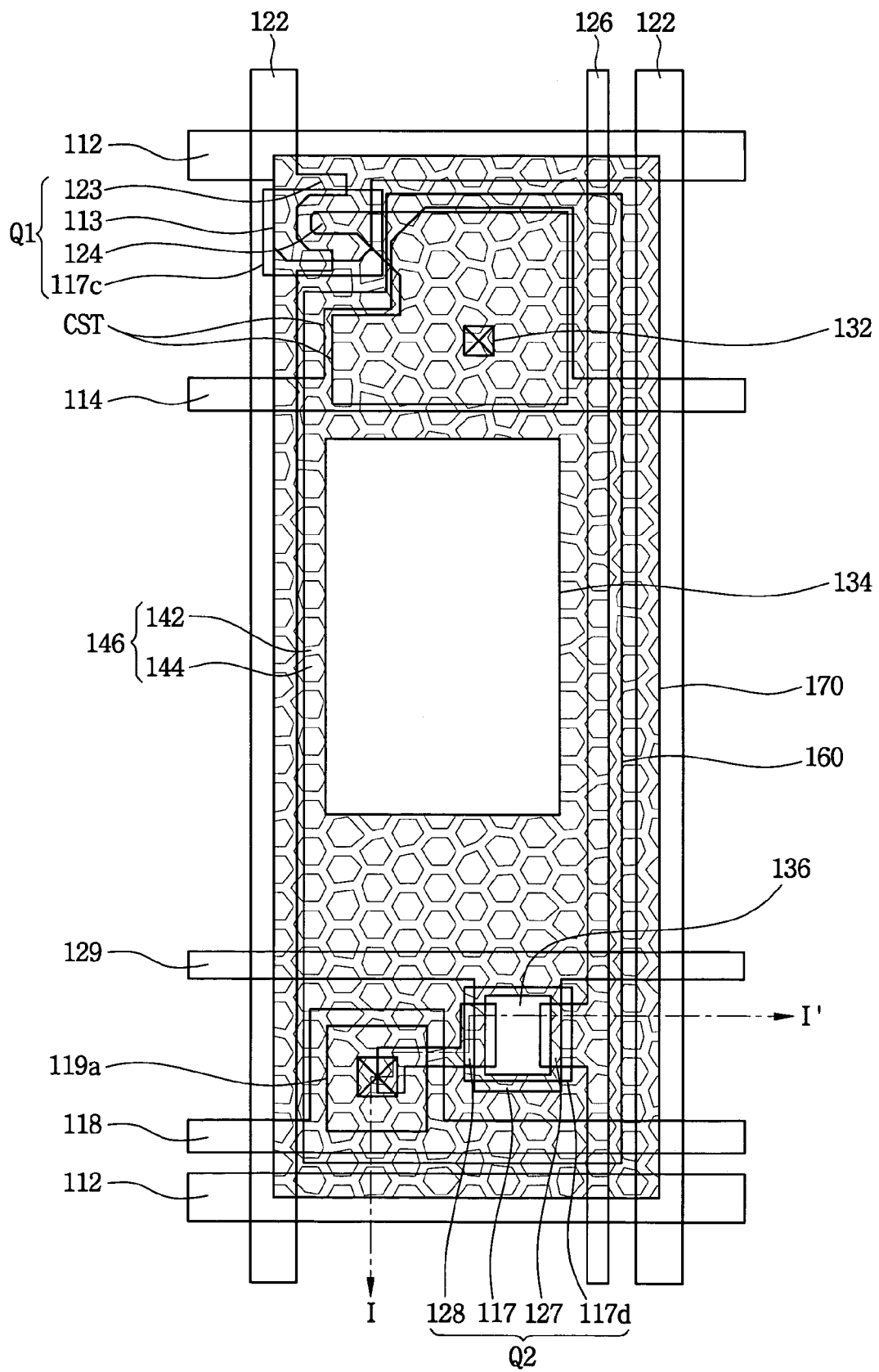
FIG. 3 is a schematic plan view illustrating an array substrate.
Figure 4:
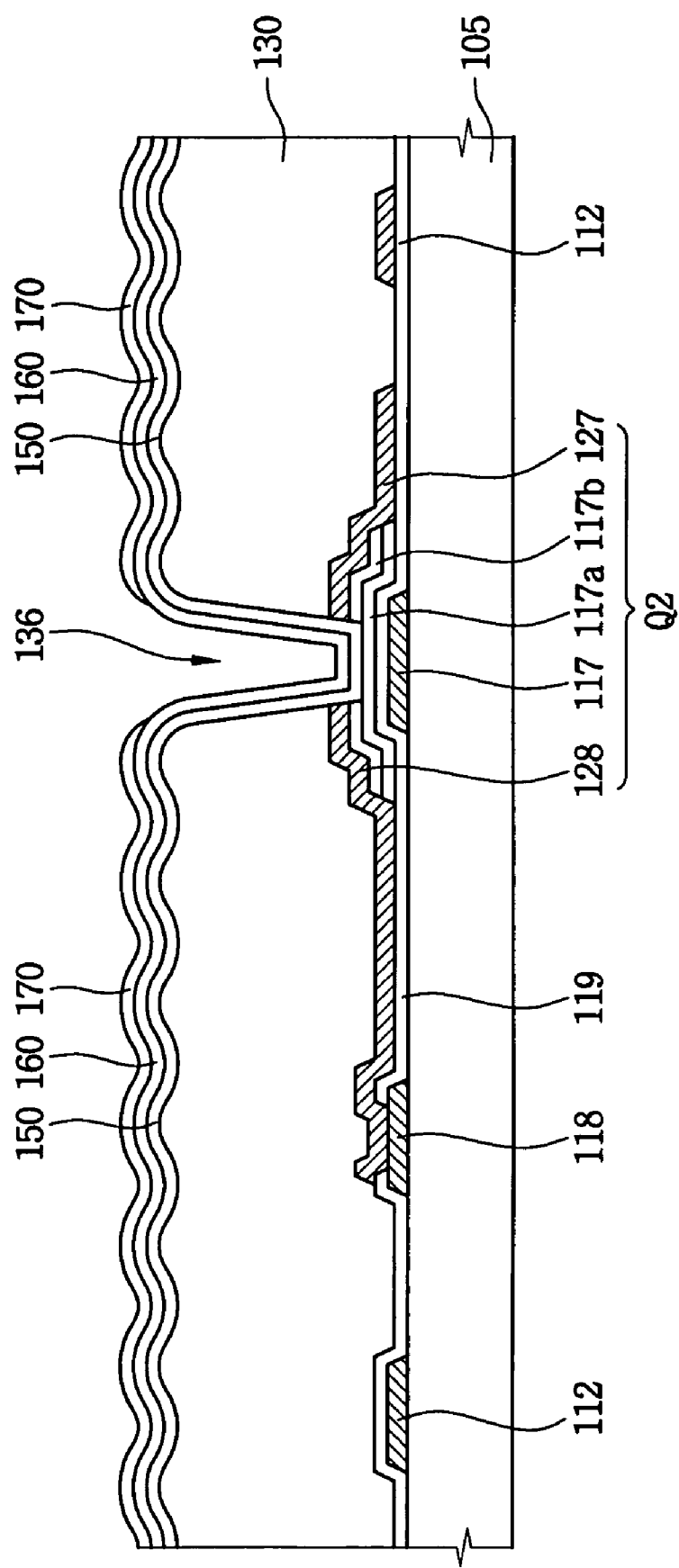
FIG. 4 is a cross-sectional view taken along a line I–I' in FIG. 3.

FIG. 3 is a schematic plan view illustrating an array substrate, and FIG. 4 is a cross-sectional view taken along a line I–I' in FIG. 3.

Referring to FIGS. 3 and 4, an array substrate according to an exemplary embodiment of the present invention includes a plurality of gate lines 112, a plurality of source lines 122, a switching device Q1 that is electrically connected to the gate line 112 and the source line 122, a storage capacitor CST, a first power source line 129, a second power source line 118, a light sensing device Q2, a readout line 126, a pixel electrode 160 and a reflection layer 170 that defines a transmissive region and a reflective region.

The gate lines 112 are formed on a transparent substrate, such that the gate lines 112 are extended in a horizontal direction. The source lines 122 are formed on a transparent substrate, such that the source lines 122 are extended in a vertical direction. Therefore, the gate lines 112 and the source lines 122 define a plurality of pixel regions.

The switching device Q1 is formed in the pixel region, and the switching device Q1 includes a first gate electrode line 113, a first source electrode line 123 and a first drain electrode 124. The first gate electrode line 113 is extended from the gate line 112, and the first source electrode line 123 is extended from the source line 122. The first drain electrode line 124 is spaced apart from the first source electrode line 123.

The storage capacitor CST is defined by a storage electrode line 114 and the first drain electrode line 124.

The first power source line 129 and the second power source line 118 are substantially parallel with the gate line 112. That is, the first and second power source lines 129 and 118 are extended in the horizontal direction.

The readout line 126 is substantially parallel with the source line 122. That is, the readout line 126 is extended in the vertical direction.

The light sensing device Q2 includes a second gate electrode region 117, a second source electrode line 127 and a second drain electrode line 128. The second gate electrode region 117 is extended from the first power source line 129, and the second source electrode line 127 is extended from the readout line 126. The second drain electrode line 128 is spaced apart from the second source electrode line 127.

The pixel electrode 160 includes an optically transparent and electrically conductive material such as indium tin oxide (ITO), indium zinc oxide (IZO), etc. The pixel electrode 160 is formed in the pixel region, and the pixel electrode 160 is electrically connected to the first drain electrode line 124, so that a pixel voltage for displaying images may be applied to the pixel electrode 160 via the first drain electrode line 124.

The reflection layer 170 is disposed on the pixel electrode 160, and the reflection layer 170 includes a reflection region and a transmission region (or transmissive window) 134. The reflection region reflects an ambient light, and the transmission region 134 transmits an artificial light. Additionally, the reflection layer 170 includes an opening that is disposed over the channel layer of the second switching device. Therefore, the ambient light may arrive at the channel layer.

FIGS. 5A to 5E are schematic plan views illustrating a process of manufacturing the array substrate in FIG. 3.

Figure 5A:
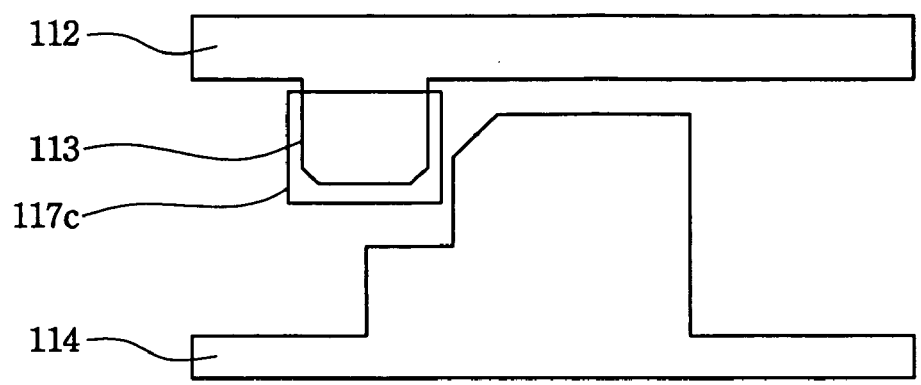
FIGS. 5A to 5E are schematic plan views illustrating a process of manufacturing the array substrate in FIG. 3.
Figure 5A:
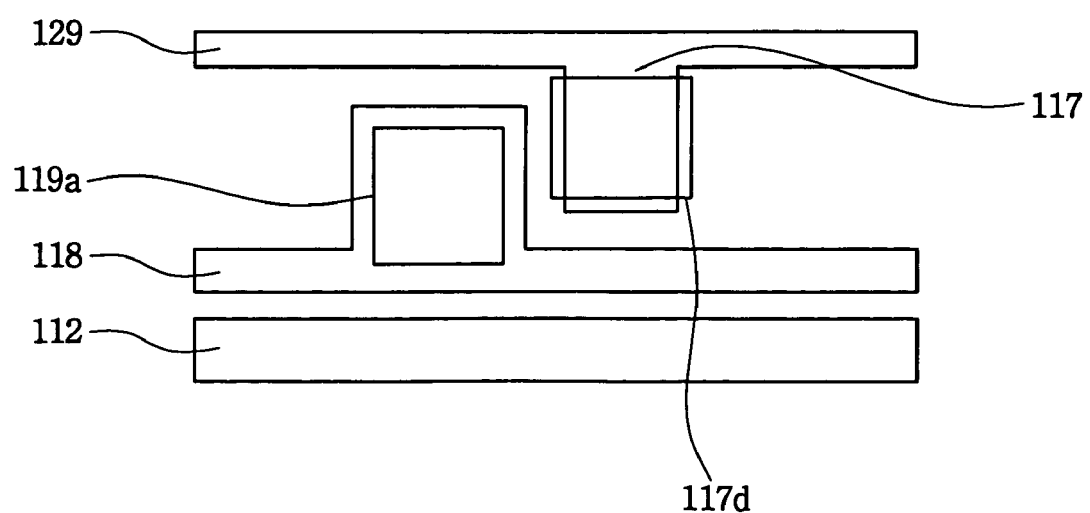

Referring to FIGS. 3 and 5A, a metal, for example, such as tantalum (Ta), titanium (Ti), molybdenum (Mo), aluminum (Al), chromium (Cr), tungsten (W), etc., are deposited on a transparent substrate 105 including glass or ceramic to form a metal layer. The metal layer is patterned to form a gate line 112, a first gate electrode line 113, a storage electrode line 114, a first power source line 116, a second gate electrode line 117 and a second power source line 118.

The gate line 112 is extended in the horizontal direction, and arranged in the vertical direction. The first gate electrode line 113 is protruded from the gate line 112. The storage electrode line 114, the first power source line 116 and the second power source line 118 are substantially parallel with the gate line 112. The second gate electrode line 117 is protruded from the first power source line 116.

Then, a silicon nitride layer is formed on the substrate having the first gate electrode line 113 formed thereon by a plasma enhanced chemical vapor deposition (PECVD) method to form a gate insulation layer 119. An amorphous silicon layer and n+ amorphous silicon layer are formed on the gate insulation layer 119 and patterned to form first and second active layers 117c and 117d including a semiconductor layer 117a and an ohmic contact layer 117b, respectively. A portion of the gate insulation layer 119, which corresponds to a portion of the second power source line 118, is removed to from a hole 119a.

The gate insulation layer 119 may be formed on entire upper surface of the substrate, or the gate insulation layer 119 may be patterned to cover only the gate line 112 and the first gate electrode line 113.

Figure 5B:
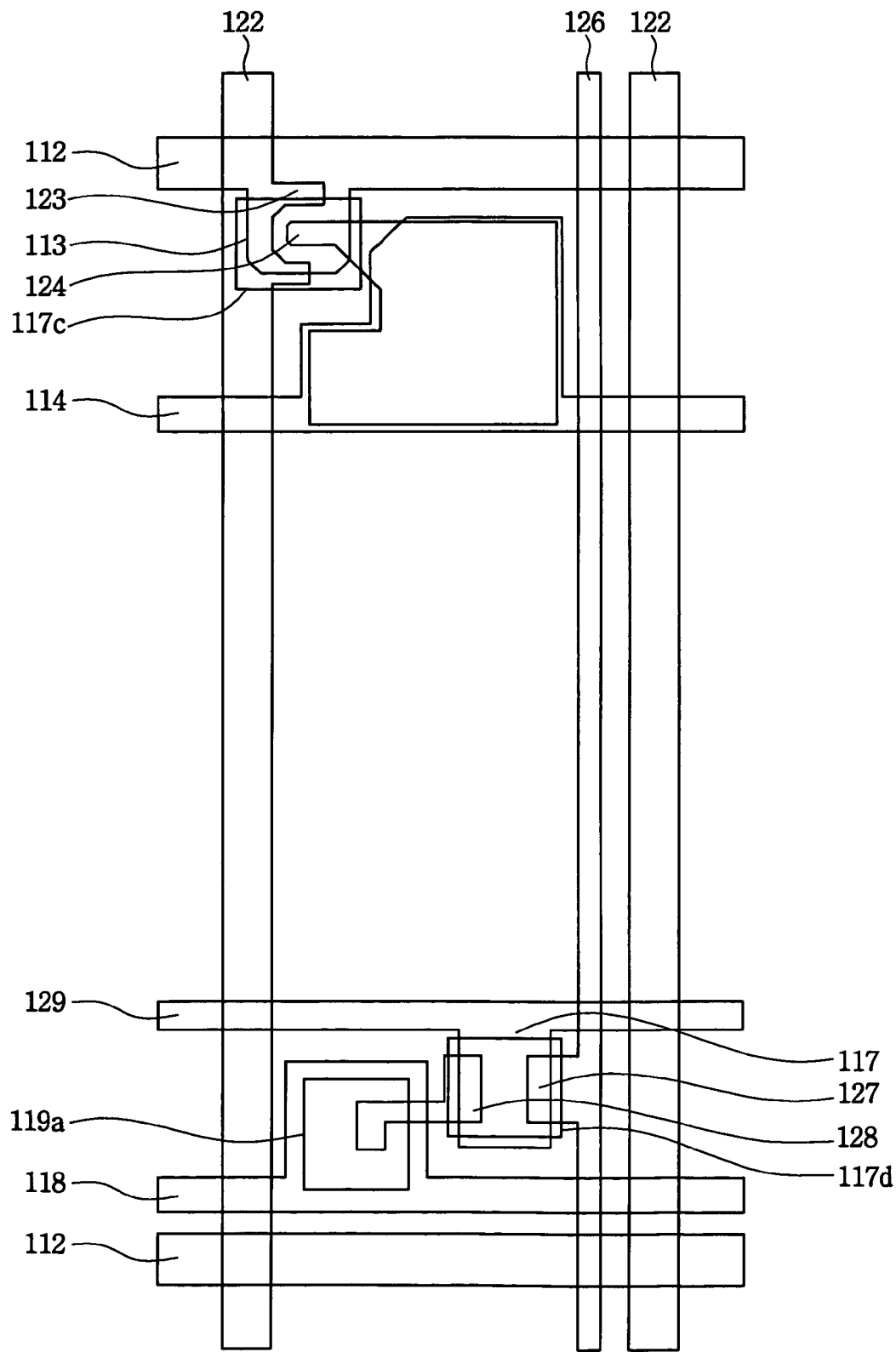

Referring to FIG. 5B, a metal, for example, such as tantalum (Ta), titanium (Ti), molybdenum (Mo), aluminum (Al), chromium (Cr), tungsten (W), etc., are deposited on the gate insulation layer having the first and second active layers 117c and 117d formed thereon to form a metal layer.

Then, the metal layer is patterned to form a source line 122, a first source electrode line 123, a first drain electrode line 124, a readout line 126, a second source electrode line 127 and a second drain electrode line 128. A portion of the first drain electrode line 124 overlaps with a portion of the storage electrode line 114 to from a storage capacitor CST.

The source electrode line 122 is extended in the vertical direction, and arranged along the horizontal direction. The first source electrode line 123 is protruded from the source line 122. The first drain electrode line 124 is spaced apart from the first source electrode line 123. A portion of the first drain electrode line 124 overlaps with a portion of the storage electrode line 114 to form the storage capacitor CST.

The readout line 126 is extended in the vertical direction, and arranged in the horizontal direction. The second source electrode line 127 is protruded from the readout line 126. The second drain electrode line 128 is spaced apart from the second source electrode line 127. The second drain electrode line 128 is electrically connected to the second power source line 118 via the hole 119a.

Figure 5C:
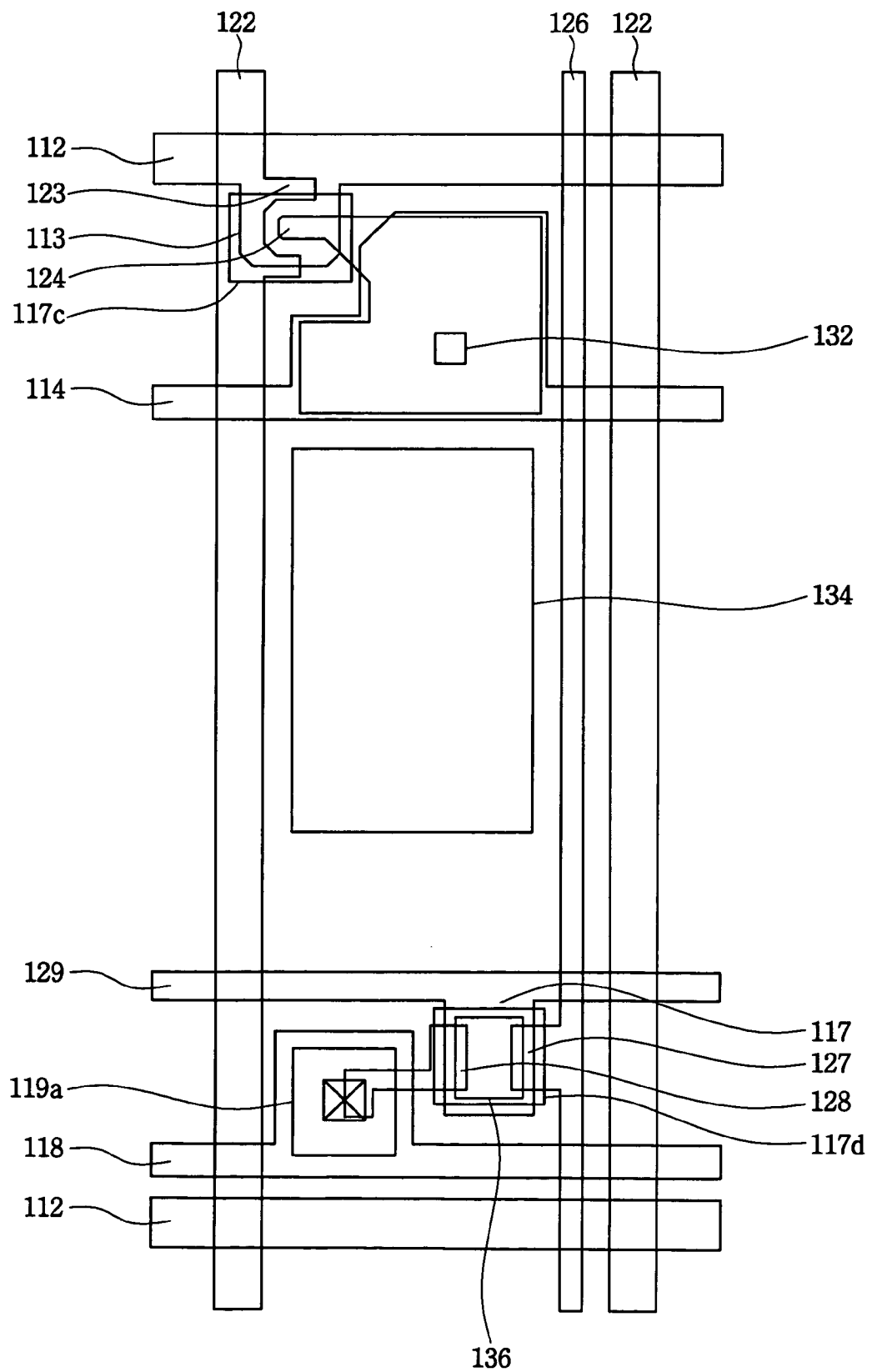

Referring to FIG. 5C, an organic insulation layer 130 is formed on the substrate having a source line 122, a first source electrode line 123, a first drain electrode line 124, a readout line 126, a second source electrode line 127 and a second drain electrode line 128 formed thereon. The organic insulation layer 130 may be formed via spin coating method. Then, a portion of the organic insulation layer 130 is removed to form a contact hole 132 for exposing a portion of the first drain electrode line 124, a transmissive window 134 for exposing the transparent substrate 105, and an opening 136 for exposing the semiconductor layer 117a formed on the second gate electrode line 116.

Figure 5D:
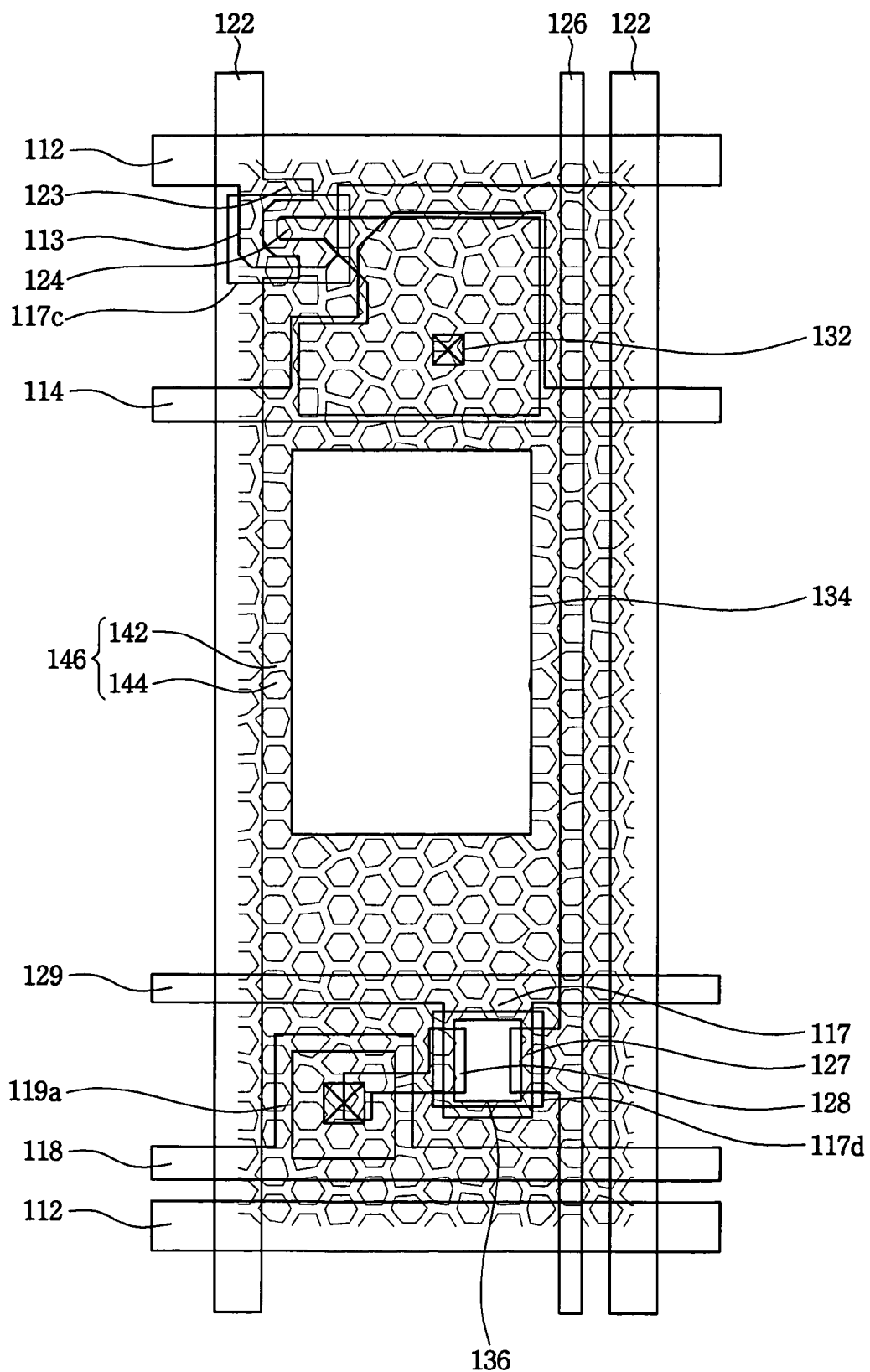

Referring to FIG. 5D, an embossing pattern 146 having protrusion 144 and recession 142 is formed on the organic insulation layer 130, and then a passivation layer 150 is formed. The embossing pattern 146 enhances reflectivity of a reflective layer that is to be formed.

Figure 5E:
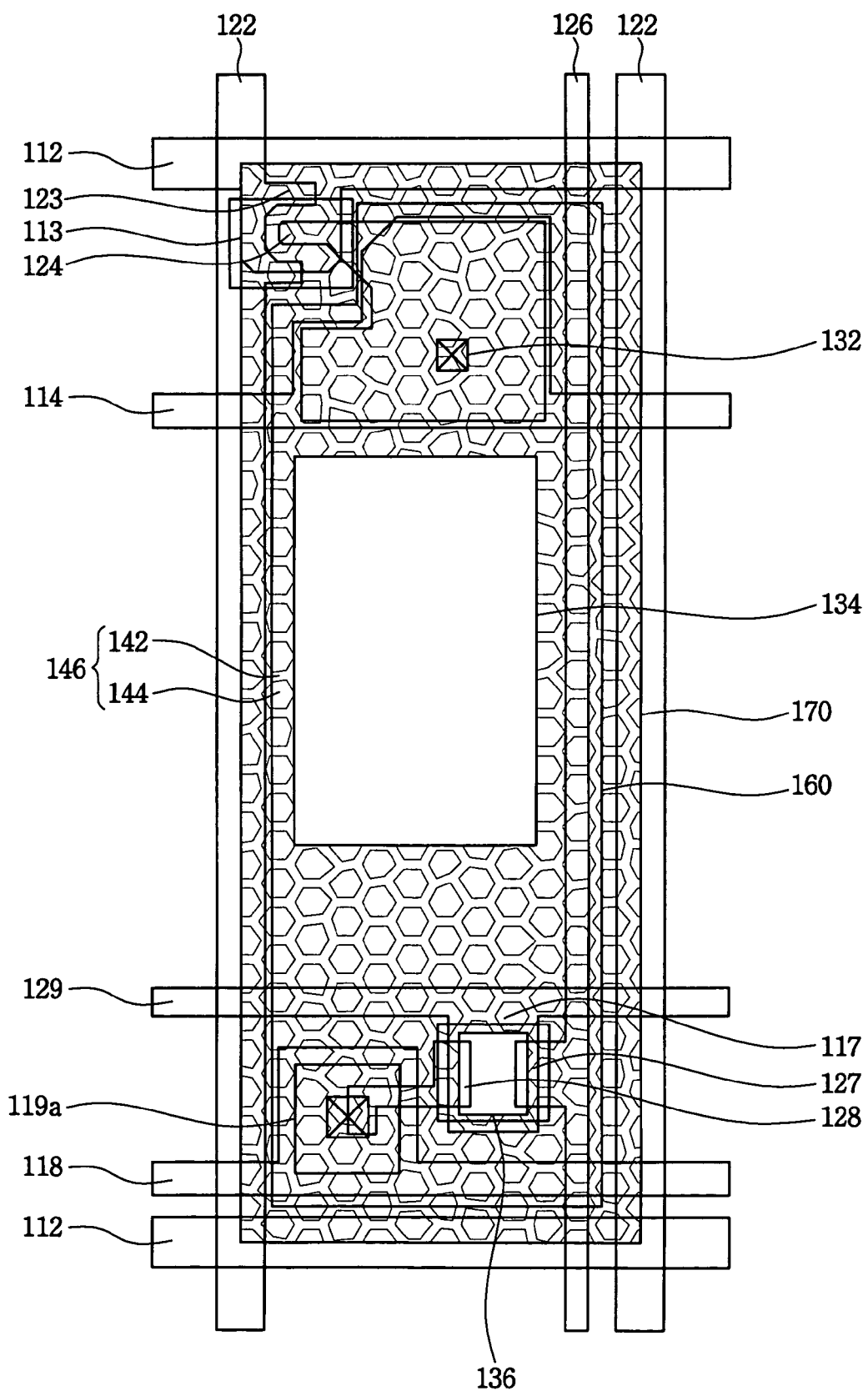

Referring to FIG. 5E, a pixel electrode 160 including ITO is formed on the passivation layer 150. The pixel electrode 160 is electrically connected to the first drain electrode line 124 via the contact hole 132. An ITO layer may be coated entirely and patterned to form the pixel electrode 160, or the ITO layer may be coated partially to form the pixel electrode 160. For example, the pixel electrode 160 is spaced apart from the source line 122 and the gate line 112. However, a portion of the pixel electrode 160 may be overlapped with the source line 122 and the gate line 112.

Then, a reflection layer 170 is formed to complete the array substrate in FIG. 3.

The reflection layer 170 does not cover the transmissive window 134 to define a transmission region. Additionally the reflection layer 170 does not cover the opening 136, so that an external light may arrive at the active layer of the second switching device Q2. An alignment film (not shown) is formed on the reflection layer 170. For example, the reflection layer 170 is divided according to the pixel region. However, the reflection layer 170 may be formed in one body. Furthermore, the organic insulation layer may not include the embossing pattern 146 to make a surface of the organic insulation layer flat.

Figure 6:
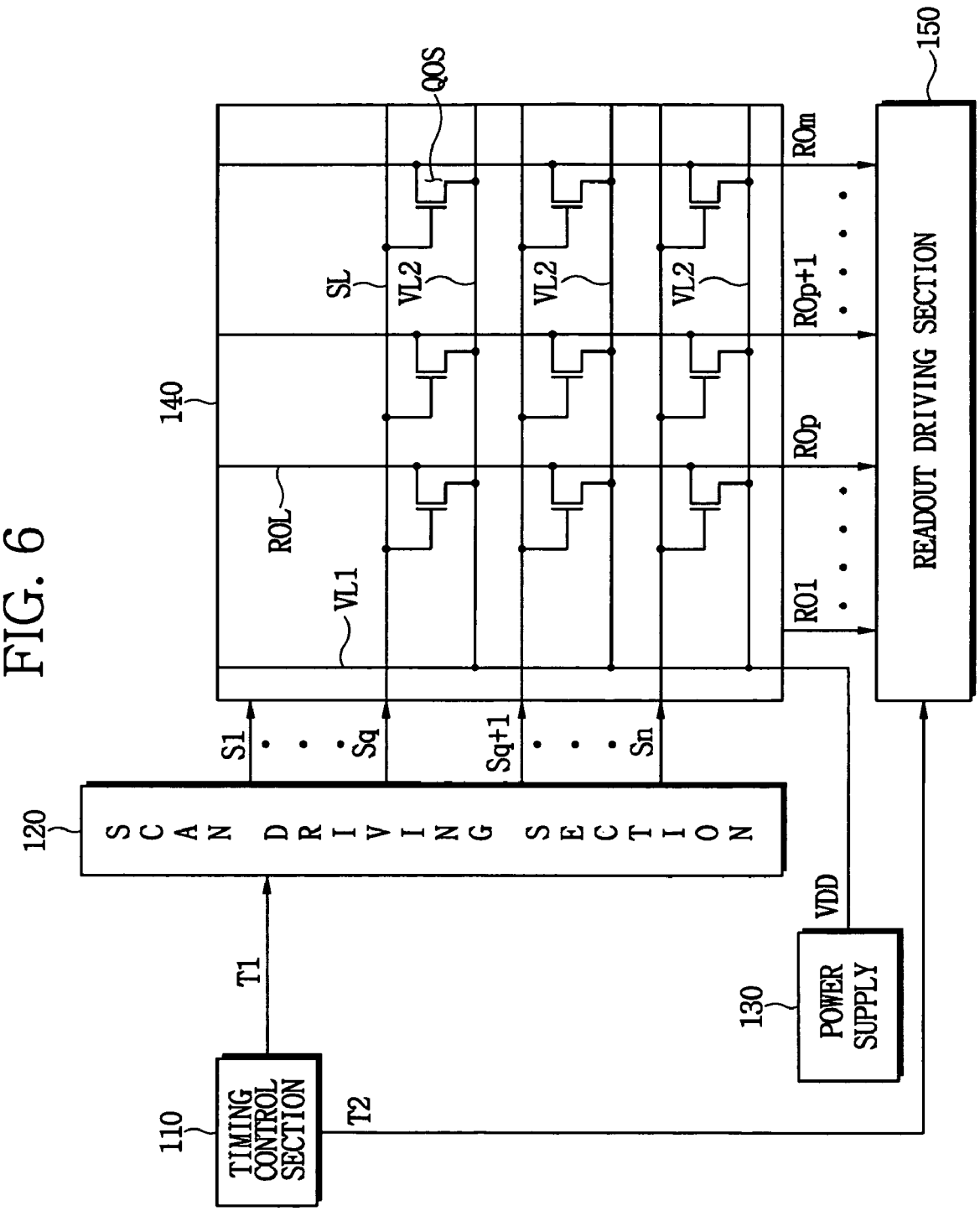
FIG. 6 is a schematic view illustrating a light sensing device according to an another exemplary embodiment of the present invention.

FIG. 6 is a schematic view illustrating a light sensing device according to an another exemplary embodiment of the present invention.

Referring to FIG. 6, a light sensing device according to an exemplary embodiment of the present invention includes a timing control section 110, a scan driving section 120, a power supply 130, a light sensing panel 140 and a readout driving section 150.

The timing control section 110 provides the scan driving section 120 with a first timing signal T1, and the timing control section 110 provides the readout driving section 150 with a second timing signal T2 for sensing a light. The first timing signal T1 controls a start of the scan driving section 120, and the second timing signal T2 controls a start of the readout driving section 150.

When the scan driving section 120 receives the first timing signal T1, the scan driving section 120 provides the light sensing panel 140 with scan signals S1, . . . Sq, Sq+1, . . . , Sn. Preferably, the scan signals S1, . . . Sq, Sq+1, . . . , Sn do not overlap with each other. The scan signals S1, . . . Sq, Sq+1, . . . , Sn swing between about −7.5V and about 5V.

The power supply 130 applies a bias voltage VDD to the light sensing panel 140. The bias voltage VDD is about 15V. That is, the bias voltage is larger than the high level of the scan signal.

The light sensing panel 140 includes a plurality of first power source lines VL1, a plurality of second power source lines VL2, a plurality of readout lines ROL, and a plurality of light sensing devices QOS.

In detail, the light sensing panel includes an effective region and a peripheral region. The light sensing devices QOS are formed in the effective region, and the first power source lines VL1 extended in the vertical direction are formed in the peripheral region. The bias voltage VDD provided from the power supply 130 is applied to the light sensing devices QOS via the first and second power source lines VL1 and VL2.

The second power source lines VL2 are diverged from the first power source lines VL1, so that the second power source lines VL2 are extended in the horizontal direction in the effective region.

The scan lines SL are extended in the horizontal direction, and the scan signals S1, . . . Sq, Sq+1, . . . , Sn are applied to the light sensing devices QOS via the scan lines SL.

The light sensing device QOS includes a drain electrode that is electrically connected to the second power source line VL2, a gate electrode that is electrically connected to the scan line SL, and a source electrode that is electrically connected to the readout line ROL. When the scan signal is applied to the light sensing device QOS, the light sensing device QOS is turned on so as to apply a light sensing signal to the readout line ROL.

For example, the light sensing device QOS corresponds to a bottom gate type amorphous silicon thin film transistor.

The readout line ROL is extended in the vertical direction, and the source electrode of the light sensing device QOS is electrically connected to the readout line ROL. Therefore, the light sensing signal is applied to the readout driving section 150 via the readout line ROL.

The readout driving section 150 receives the light sensing signal, and transforms the light sensing signal into data. The data is provided to the timing control section 110.

An exemplary operation will be explained in detail.

For example, a light arrives at the light sensing device QOS that is electrically connected to (p+1)th readout line. When a scan signal of low level of about −7.5V is applied to a gate electrode of the light sensing device QOS corresponding to qth scan line SL, the light sensing signal QOS corresponding to qth scan line is in a high impedance state. However, when a scan signal of high level of about 5V is applied to a gate electrode of the light sensing device QOS corresponding to (q+1)th scan line SL, the light sensing signal QOS corresponding to (q+1)th scan line is in a low impedance state.

Therefore, a position of pixel where the light arrives thereto may be detected by the impedance. That is, the position corresponds to (p+1)th readout line and (q+1)th scan line SL.

In other words, the position may be detected via the second timing signal T2 synchronized with the scan signal outputted sequentially from the scan driving section 120.

Figure 7:
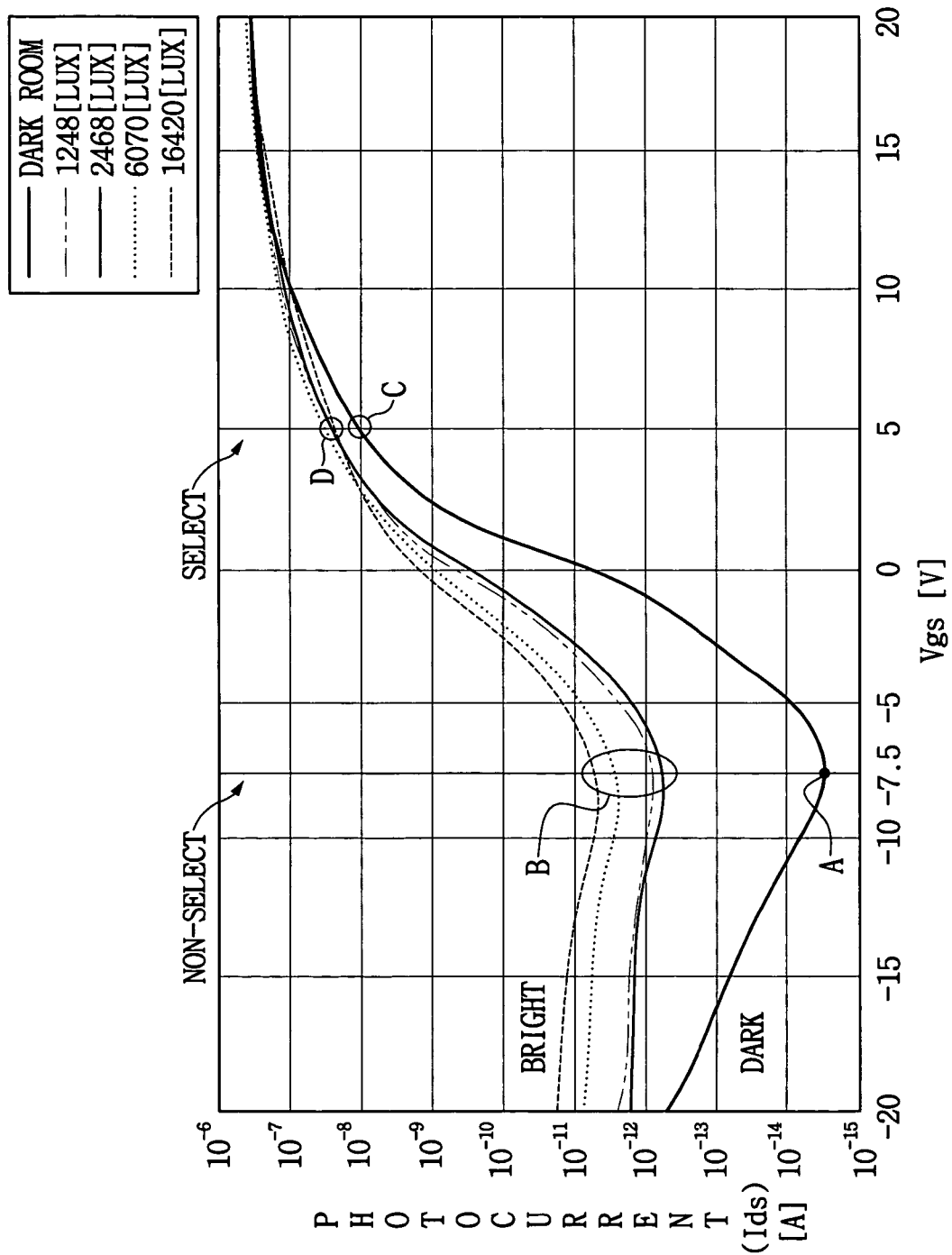
FIG. 7 is a graph illustrating a relationship between a voltage applied to the light sensing device and an output current.

FIG. 7 is a graph illustrating a relationship between a voltage applied to the light sensing device and an output current. In particular, FIG. 7 illustrates a relationship between a voltage difference between gate and source electrodes of a light sensing device QOS, and a photocurrent.

A variation of a photocurrent Ids of one light sensing sensor having only one thin film transistor in accordance with an increase of the voltage difference Vgs between the gate and source electrode of the light sensing device in a darkroom is as follows.

When the voltage difference Vgs is about −20V, the photocurrent Ids is lower than about $10^{-12}$ ampere (A). As the voltage difference Vgs increases, the photocurrent Ids decreases. However, when the voltage difference Vgs exceeds about −7.5V, the photocurrent Ids increases. When the voltage difference Vgs exceeds about 5V, the photocurrent Ids is saturated.

A variation of the photocurrent Ids of the light sensing sensor under 1248 lux in accordance with an increase of the voltage difference Vgs between the gate and source electrodes of the light sensing device is as follows.

When the voltage difference Vgs is about −20V, the photocurrent Ids is lower than about $10^{-12}$ A. When the voltage difference Vgs increases gradually, the photocurrent Ids decreases. However, when the voltage difference Vgs exceeds about −7.5V, the photocurrent Ids increases. When the voltage difference Vgs exceeds 5V, the photocurrent Ids is saturated.

Variations of the photocurrent Ids of the light sensing sensor under 2468 lux, 6070 lux and 16420 lux in accordance with an increase of the voltage difference Vgs between the gate and source electrodes of the light sensing device have substantially same pattern as the variation of the photocurrent Ids of the light sensing sensor under 1248 lux.

A maximum voltage difference Vgs corresponding to the darkroom is larger than a maximum voltage difference Vgs corresponding to a bright room.

As shown above, even though the light sensing device includes only one thin film transistor, the light sensing device may operate well, when the voltage difference Vgs between the gate and source electrodes swings between about −7.5V and about 5V.

For example, the maximum voltage difference between the gate and source electrodes is about 5V. However, the maximum voltage difference between the gate and source electrodes may be about 4V or about 3V.

Figure 8:
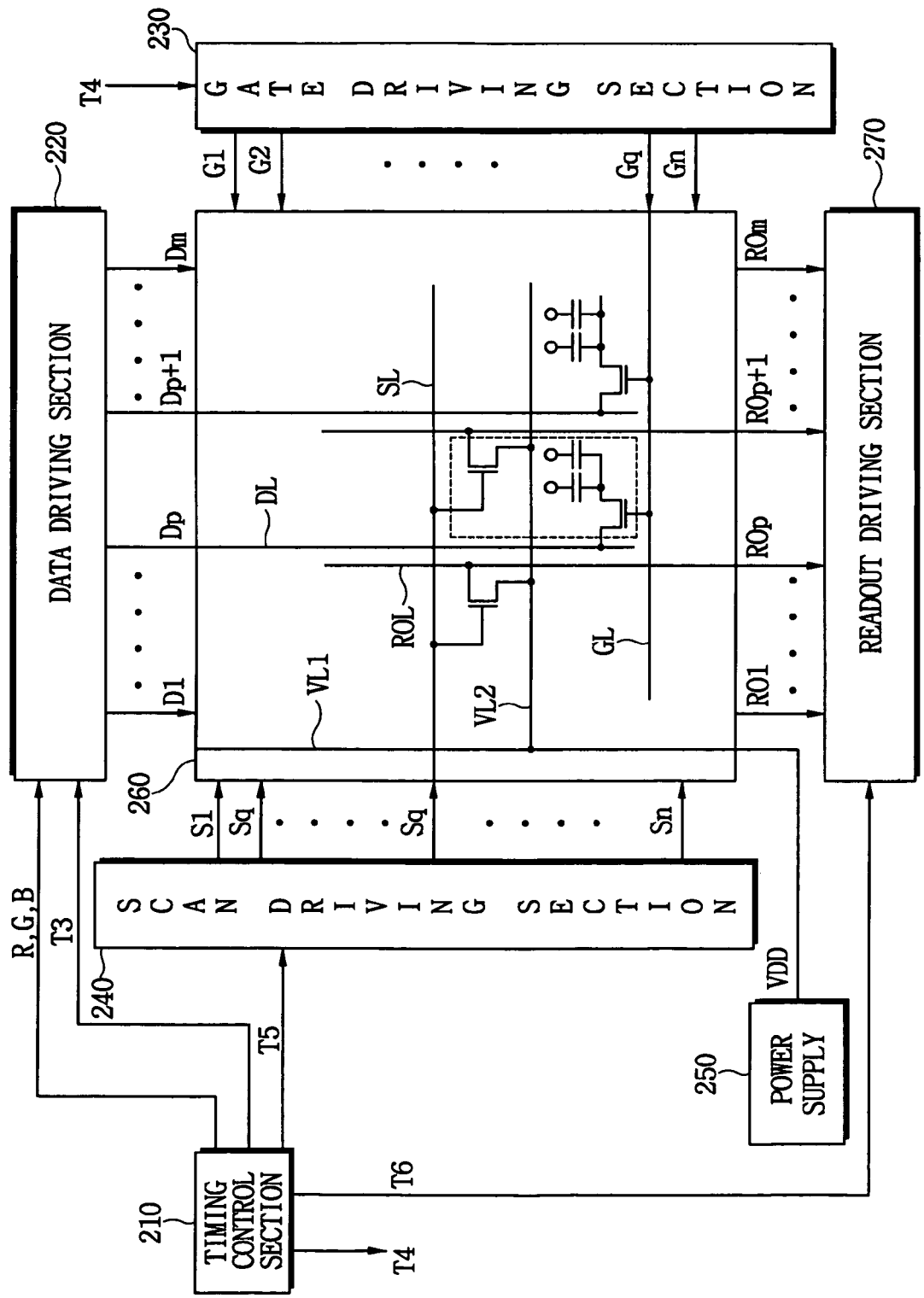
FIG. 8 is a schematic view illustrating a liquid crystal display apparatus having the light sensing device according to a still another exemplary embodiment of the present invention.

FIG. 8 is a schematic view illustrating a liquid crystal display apparatus having the light sensing device according to a still another exemplary embodiment of the present invention.

Referring to FIG. 8, a liquid crystal display apparatus according to an exemplary embodiment of the present invention includes a timing control section 210, a data driving section 220, a gate driving section 230, a scan driving section 240, a power supply 250, a light sensing panel 260 and a readout driving section 270.

The timing control section 210 provides the data driving section with image signals red (R), green (G), blue (B) and a third timing signal T3. The timing control section 210 also provides the gate driving section 230, the scan driving section 240 and readout driving section 250 with fourth, fifth and sixth timing signals T4, T5 and T6, respectively.

The data driving section 220 provides the light sensing panel 260 with m-number of data signals D1, . . . Dp, . . . , Dm, in accordance with the third timing signal T3.

The gate driving section 230 provides the light sensing panel 260 with n-number of gate signals G1, . . . Gq, . . . , Gn, in accordance with the fourth timing signal T4. Preferably, the gate signals G1, . . . Gq, . . . , Gn do not overlap with one another.

The scan driving section 240 provides the light sensing panel 260 with n-number of scan signals S1, . . . , Sq, . . . , Sn in sequence when the scan driving section 240 receives the fifth timing signal T5. Preferably, the scan signals S1, . . . , Sq, . . . , Sn do not overlap with one another.

The light sensing panel 260 includes an effective region and a peripheral region. A first power source line VL1 is formed in the peripheral region. A bias voltage VDD provided from the power supply 250 is applied to the first power source line VL1.

A gate line GL, a data line DL, a switching device Q1, a liquid crystal capacitor CLC and a storage capacitor CST are formed in the effective region. The switching device Q1 is formed in the region defined by the gate and data lines GL and DL, and the switching device Q1 is electrically connected to the gate and data lines GL and DL. The liquid crystal capacitor CLC and the storage capacitor CST are electrically connected to the switching device Q1. The liquid crystal capacitor CLC is defined by a drain electrode line of the switching device Q1 and a storage electrode line to which a storage voltage VST is applied.

Additionally, the first power source line VL1, a plurality of second power source lines VL2, a plurality of scan lines SL, a plurality of readout lines ROL and a plurality of light sensing devices QOS are formed in the effective region. Detailed description is already explained referring to FIG. 6, and thus the detailed description will be omitted.

For example, the gate driving section 230 and the scan driving section 240 are disposed on right and left sides of the light sensing panel 260, respectively. However, both the gate driving section 230 and the scan driving section 240 may be formed on a same side of the light sensing panel 260.

According to the present invention, a scan voltage that is applied to a gate electrode line of a light sensing device has a low level of about −7.5V and a high level of about 5V, so that a structure of the light sensing device may be simplified without forming a reverse current path. Therefore, an aperture ratio is prevented from being decreased.

Furthermore, a distance between lines becomes larger, so that interference between the lines is reduced.

Having described the exemplary embodiments of the present invention and its advantages, it is noted that various changes, substitutions and alterations can be made herein without departing from the spirit and scope of the invention as defined by appended claims.

What is claimed is:

1. A light sensing panel comprising:
   a scan line that transmits a scan signal swinging between high and low levels;
   a power source line that transmits a bias voltage;
   a readout line that transmits a light sensing signal; and
   a light sensing device including a control electrode that is electrically connected to the scan line to receive the scan signal, a first current electrode that is electrically connected to the power source line to receive the bias voltage, and a second current electrode that is electrically connected to the readout line to apply a light sensing signal to the readout line when the light sensing signal senses an external light.

2. The light sensing panel of claim 1, wherein the light sensing signal comprises an amorphous silicon thin film transistor.

3. The light sensing panel of claim 1, wherein the high level of the scan signal is ranged from about 3V to about 5V.

4. The light sensing panel of claim 1, wherein the scan signal swings between about −7.5V and about 5V.

5. The light sensing panel of claim 1, wherein the bias voltage is larger than the high level of the scan signal.

6. A light sensing panel comprising: a gate line that transmits a gate signal;
   a data line that transmits a data signal;
   a pixel part formed in a first region defined by the gate line and the data line;
   a scan line that transmits a scan signal that swings between high and low levels;
   a power source line that transmits a bias voltage;
   a readout line that transmits a light sensing signal; and
   a light sensing part formed in a second region defined by the scan line, the power source line and the readout line, the light sensing part applying the light sensing signal to the readout line by the scan signal and the bias voltage when the light sensing part receives an external light.

7. The light sensing panel of claim 6, wherein the power source line comprises a first power source line formed outside of the second region, and a second power source line that diverges from the first power source line to be disposed in the second region, so that the second power source line transfers the bias voltage from the first power source line to the light sensing part.

8. The light sensing panel of claim 6, wherein the pixel part comprises:
  a pixel electrode; and
  a switching device including a control electrode that is electrically connected to the gate line, a first current electrode that is electrically connected to the data line, and a second current electrode that is electrically connected to the pixel electrode.

9. The light sensing panel of claim 6, wherein the light sensing part comprises only one thin film transistor.

10. The light sensing panel of claim 6, wherein the light sensing part comprises an amorphous silicon thin film transistor.

11. The light sensing panel of claim 6, wherein the light sensing part comprises a light sensing device including a control electrode that is electrically connected to the scan line to receive the scan signal, a first current electrode that is electrically connected to the power source line to receive the bias voltage, and a second current electrode that is electrically connected to the readout line to apply the light sensing signal.

12. A liquid crystal display apparatus comprising:
  an upper substrate;
  a lower substrate including a light sensing part formed in a region defined by a scan line, a power source line and a readout line, the light sensing part applying a light sensing signal to the readout line by a scan signal that is provided from the scan line and swings between high and low levels, and a bias voltage that is provided from the power source line; and
  a liquid crystal layer interposed between the upper and lower substrates.

13. The liquid crystal display apparatus of claim 12, wherein the lower substrate further comprises a pixel part including:
  a switching device including a control electrode that is electrically connected to a gate line and a first current electrode that is electrically connected to a data line;
  a liquid crystal capacitor that is electrically connected to a second current electrode of the switching device; and
  a storage capacitor that is electrically connected to the second current electrode of the switching device.

14. The liquid crystal display apparatus of claim 13, wherein both the pixel part and the light sensing part comprise an amorphous silicon thin film transistor.

15. The liquid crystal display apparatus of claim 12, wherein the light sensing part comprises only one thin film transistor.

16. The liquid crystal display apparatus of claim 12, further comprising:
  a gate driving section that applies a gate signal to a gate line; and
  a scan driving section that applies a scan signal to the scan line.

17. The liquid crystal display apparatus of claim 16, wherein the gate driving section is formed on the lower substrate.

18. The liquid crystal display apparatus of claim 16, wherein the scan driving section is formed on the lower substrate.

* * * * *